(12) United States Patent
Cho et al.

(10) Patent No.: US 9,437,570 B2
(45) Date of Patent: *Sep. 6, 2016

(54) POWER CONVERTER PACKAGE WITH AN INTEGRATED OUTPUT INDUCTOR

(71) Applicant: Infineon Technologies Americas Corp., El Segundo, CA (US)

(72) Inventors: Eung San Cho, Torrance, CA (US); Kevin Moody, Riverside, CA (US); Parviz Parto, Laguna Niguel, CA (US)

(73) Assignee: Infineon Technologies Americas Corp, El Segundo, CA (US)

( * ) Notice: Subject to any disclaimer, the term of this patent is extended or adjusted under 35 U.S.C. 154(b) by 0 days.

This patent is subject to a terminal disclaimer.

(21) Appl. No.: 14/538,483

(22) Filed: Nov. 11, 2014

(65) Prior Publication Data

US 2015/0162297 A1 Jun. 11, 2015

Related U.S. Application Data

(60) Provisional application No. 61/912,123, filed on Dec. 5, 2013.

(51) Int. Cl.
| | |
|---|---|
| *H01L 23/52* | (2006.01) |
| *H01L 23/00* | (2006.01) |
| *H01L 23/495* | (2006.01) |
| *H02M 3/155* | (2006.01) |

(52) U.S. Cl.
CPC ............. *H01L 24/49* (2013.01); *H01L 23/495* (2013.01); *H01L 23/49562* (2013.01); *H01L 23/49575* (2013.01); *H01L 24/32* (2013.01); *H02M 3/155* (2013.01); *H01L 24/45* (2013.01); *H01L 24/48* (2013.01); *H01L 24/73* (2013.01); *H01L 2224/32257* (2013.01); *H01L 2224/32265* (2013.01); *H01L 2224/45014* (2013.01); *H01L 2224/45015* (2013.01); *H01L 2224/45124* (2013.01); *H01L 2224/45144* (2013.01); *H01L 2224/45147* (2013.01); *H01L 2224/48091* (2013.01); *H01L 2224/48092* (2013.01); *H01L 2224/48106* (2013.01); *H01L 2224/48247* (2013.01); *H01L 2224/48257* (2013.01); *H01L 2224/49109* (2013.01); *H01L 2224/49176* (2013.01); *H01L 2224/73265* (2013.01); *H01L 2924/1032* (2013.01); *H01L 2924/1033* (2013.01); *H01L 2924/1206* (2013.01); *H01L 2924/13055* (2013.01); *H01L 2924/13091* (2013.01); *H01L 2924/181* (2013.01); *H01L 2924/19103* (2013.01); *H01L 2924/19107* (2013.01)

(58) Field of Classification Search
CPC ................................ H02J 1/00; H03L 7/0996
USPC .......................... 257/723, 724, 686, 777, 691
See application file for complete search history.

(56) References Cited

U.S. PATENT DOCUMENTS

| | | | |
|---|---|---|---|
| 8,679,896 B2 * | 3/2014 | Joshi et al. .................... 438/113 |
| 2013/0221442 A1 * | 8/2013 | Joshi ............................. 257/368 |
| 2014/0306332 A1 * | 10/2014 | Denison et al. .............. 257/676 |
| 2015/0014698 A1 * | 1/2015 | Briere ............................. 257/76 |

* cited by examiner

*Primary Examiner* — S. V. Clark
(74) *Attorney, Agent, or Firm* — Shumaker & Sieffert, P.A.

(57) ABSTRACT

In one implementation, a power semiconductor package includes a conductive carrier including a switch node segment and a power output segment. The power semiconductor package also includes an integrated output inductor stacked over the conductive carrier and configured to couple the switch node segment to the power output segment. The power semiconductor package further includes a power stage stacked over the integrated output inductor.

20 Claims, 7 Drawing Sheets

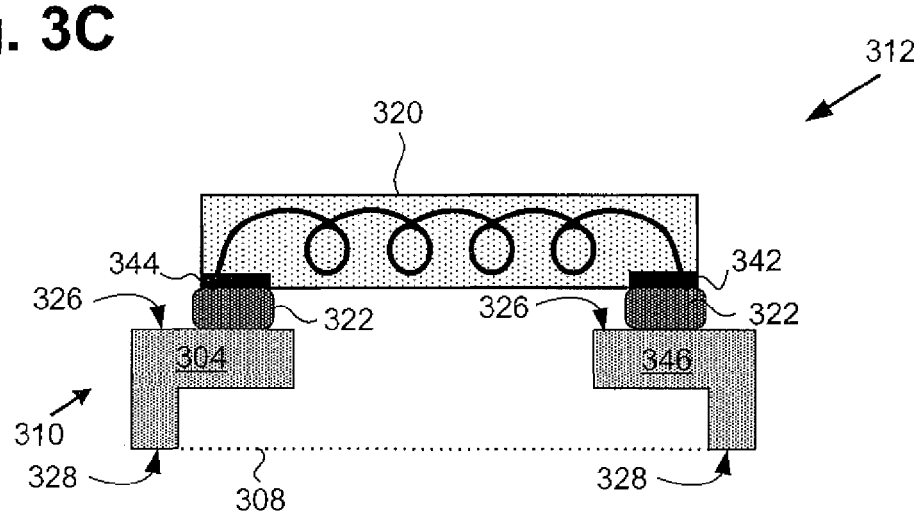
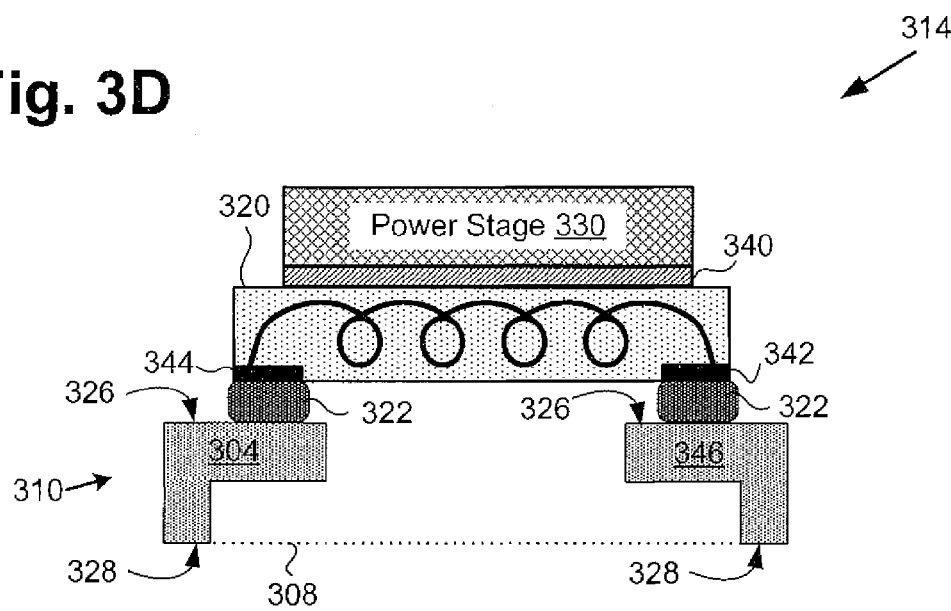

POWER CONVERTER PACKAGE WITH AN INTEGRATED OUTPUT INDUCTOR

The present application claims the benefit of and priority to a provisional application entitled "Power Converter Package with Integrated Output Inductor," Ser. No. 61/912,123, filed on Dec. 5, 2013. The disclosure in this provisional application is hereby incorporated fully by reference into the present application.

BACKGROUND

Power converters are used in a variety of electronic circuits and systems. Semiconductor packaging solutions for power converters may be configured to accommodate power transistors, a high current switch node connection between the power transistors, and an output inductor. In conventional semiconductor packages, the switch node connection between the power transistors is typically implemented using a conductive clip having a large cross-sectional area to provide a reliable, low resistance connection under high current conditions. Due to the large cross-sectional area of the conductive clip and other packaging constraints, an output inductor is generally included externally or side-by-side with the power transistors.

As advances in technology enable implementation of thinner power transistors, the semiconductor packages including the thinner power transistors have a reduced height. However, even with the reduced height, conventional approaches still adopt a planar layout by including the output inductor side-by-side with the thinner power transistors in a semiconductor package. As a result, the semiconductor package, including the thinner power transistors, and the output inductor still occupy an undesirably large area on a circuit board.

SUMMARY

The present disclosure is directed to a power converter package with an integrated output inductor, substantially as shown in and/or described in connection with at least one of the figures, and as set forth more completely in the claims.

BRIEF DESCRIPTION OF THE DRAWINGS

FIG. 3C illustrates a cross-sectional view of an implementation of the present disclosure, corresponding to an intermediate step in the flowchart in FIG. 2.

FIG. 3D illustrates a cross-sectional view of an implementation of the present disclosure, corresponding to an intermediate step in the flowchart in FIG. 2.

DETAILED DESCRIPTION

Figure 1:
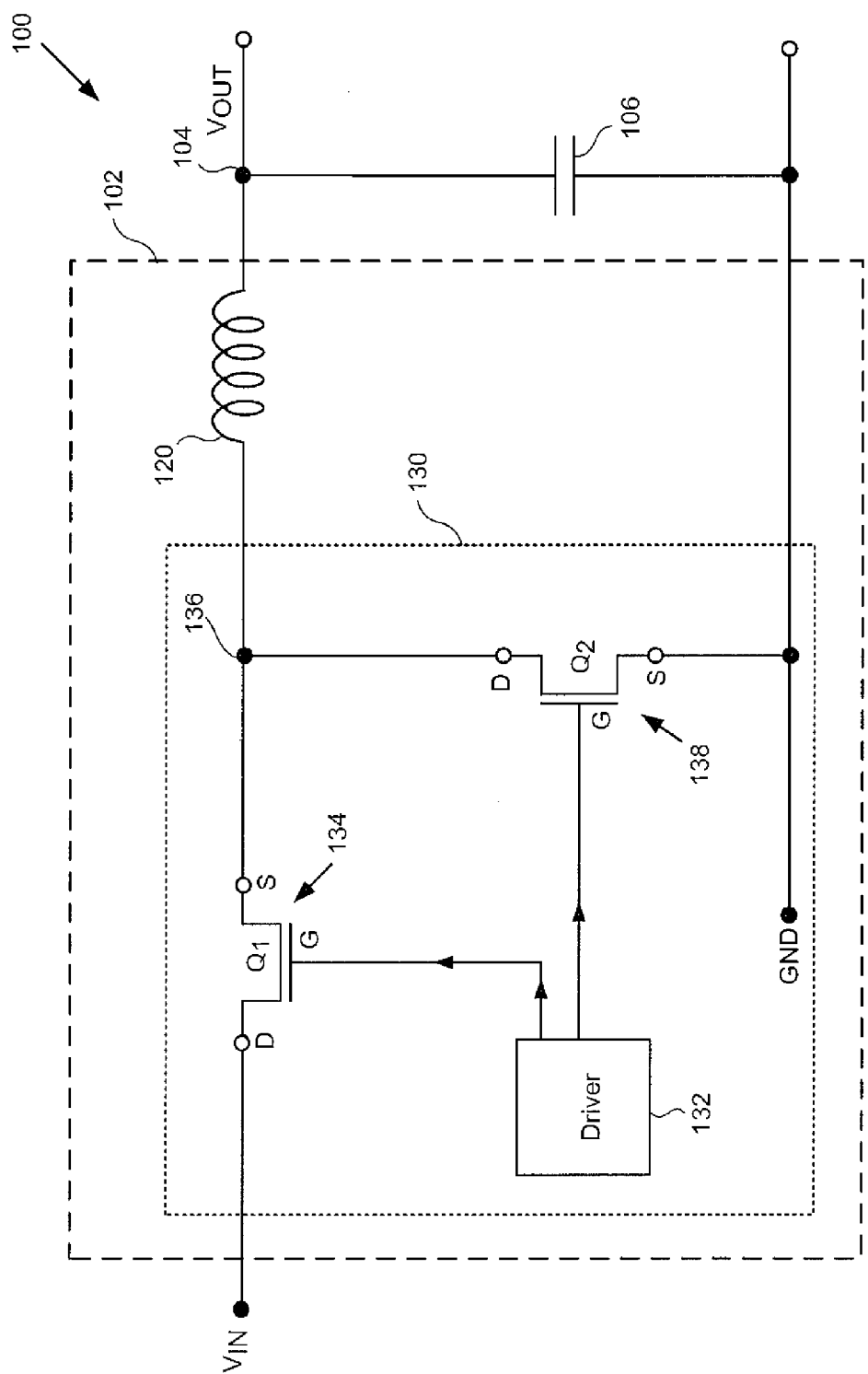
FIG. 1 illustrates a diagram of an exemplary circuit suitable for use as a power converter.

The following description contains specific information pertaining to implementations in the present disclosure. The drawings in the present application and their accompanying detailed description are directed to merely exemplary implementations. Unless noted otherwise, like or corresponding elements among the figures may be indicated by like or corresponding reference numerals. Moreover, the drawings and illustrations in the present application are generally not to scale, and are not intended to correspond to actual relative dimensions.

Power converters, such as voltage regulators, are used in a variety of electronic circuits and systems. For instance, integrated circuit (IC) applications may require conversion of a direct current (DC) input to a lower, or higher, DC output. As a specific example, a buck converter may be implemented as a voltage regulator to convert a higher voltage DC input to a lower voltage DC output for use in low voltage applications in which relatively large output currents are required.

FIG. 1 illustrates a diagram of an exemplary circuit suitable for use as a power converter. Power converter circuit 100 includes output capacitor 106, and power converter package 102. Power converter package 102 includes output inductor 120 and power stage 130. As shown in FIG. 1, power stage 130 includes high side or control transistor 134 ($Q_1$) coupled to low side or sync transistor 138 ($Q_2$) at switch node 136, as well as driver 132 implemented to provide drive signals to control transistor 134 and sync transistor 138. As further shown in FIG. 1, power converter circuit 100 is configured to receive an input voltage $V_{IN}$, and to provide a converted voltage, e.g., a rectified and/or stepped down voltage, as $V_{OUT}$ at output 104.

Control transistor 134 and sync transistor 138 of power stage 130 may take the form of metal-oxide-semiconductor field-effect transistors (MOSFETs) configured as a half bridge, for example. That is to say, control transistor 134 may be coupled to sync transistor 138 at switch node 136, which, in turn, may be coupled to output 104 through output inductor 120. In some implementations, control transistor 134 and sync transistor 138 may be implemented as group IV based power transistors, such as silicon power MOSFETs having a vertical design, for example. In other implementations, control transistor 134 and sync transistor 138 may be implemented as field-effect transistors (FETs), insulated gate bipolar transistors (IGBTs), or high electron mobility transistors (HEMTs), for example. In general, control transistor 134 and sync transistor 138 may be implemented as group IV power transistors, such as silicon power transistors, or as group III-V power transistors, such as gallium nitride (GaN) power transistors. Power converter circuit 100 may be advantageously utilized, for example as a buck converter, in a variety of automotive, industrial, appliance, and lighting applications.

It is noted that in the interests of ease and conciseness of description, the present inventive principles will in some instances be described by reference to specific implementations of a buck converter including one or more silicon based power FETs. However, it is emphasized that such implementations are merely exemplary, and the inventive principles disclosed herein are broadly applicable to a wide range of applications, including buck and boost converters, implemented using other group IV material based, or group III-V semiconductor based, power transistors.

It is further noted that as used herein, the phrase "group III-V" refers to a compound semiconductor including at least one group III element and at least one group V element. By way of example, a group III-V semiconductor may take the form of a III-Nitride semiconductor that includes nitrogen and at least one group III element. For instance, a III-Nitride power transistor may be fabricated using gallium nitride (GaN), in which the group III element or elements include some or a substantial amount of gallium, but may also include other group III elements in addition to gallium.

Figure 3A:
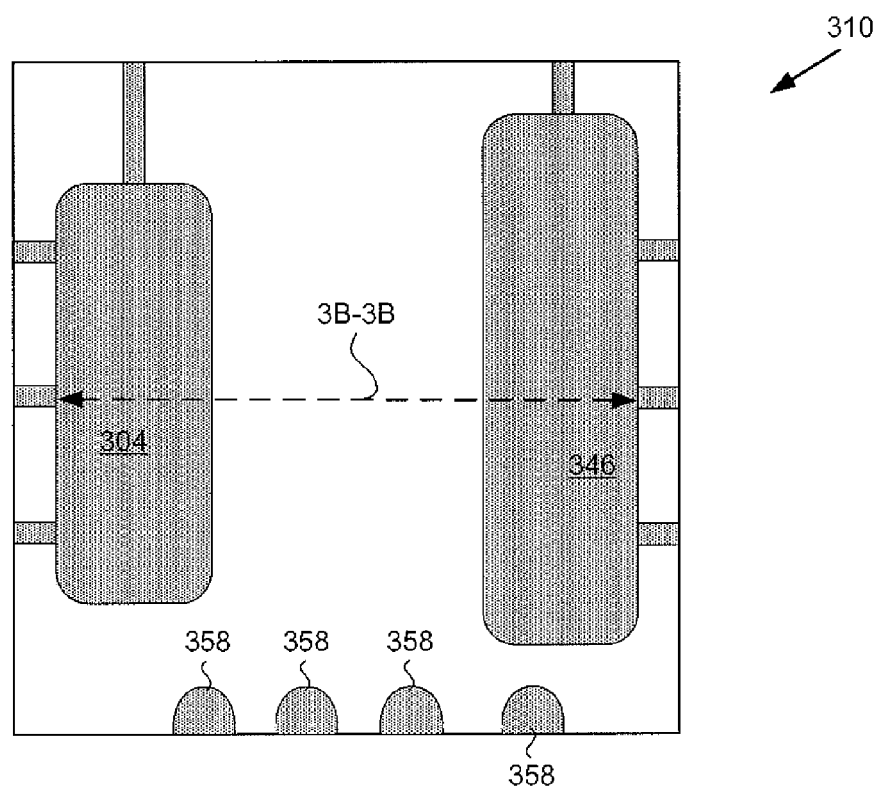
FIG. 3A illustrates a top view of an implementation of the present disclosure, corresponding to an initial step in the flowchart in FIG. 2.
Figure 3B:
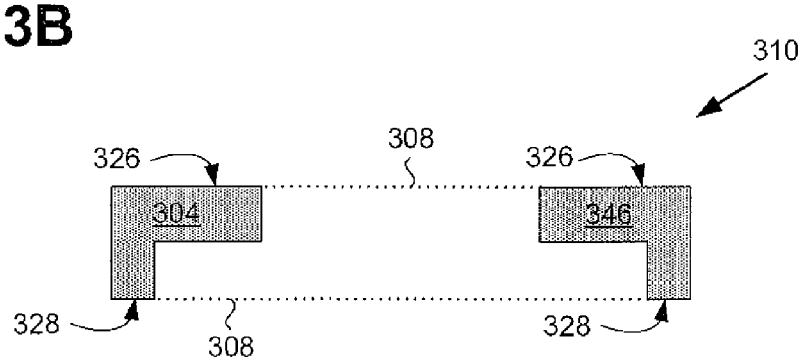
FIG. 3B illustrates a cross-sectional view of an implementation of the present disclosure, corresponding to an initial step in the flowchart in FIG. 2.
Figure 3E:
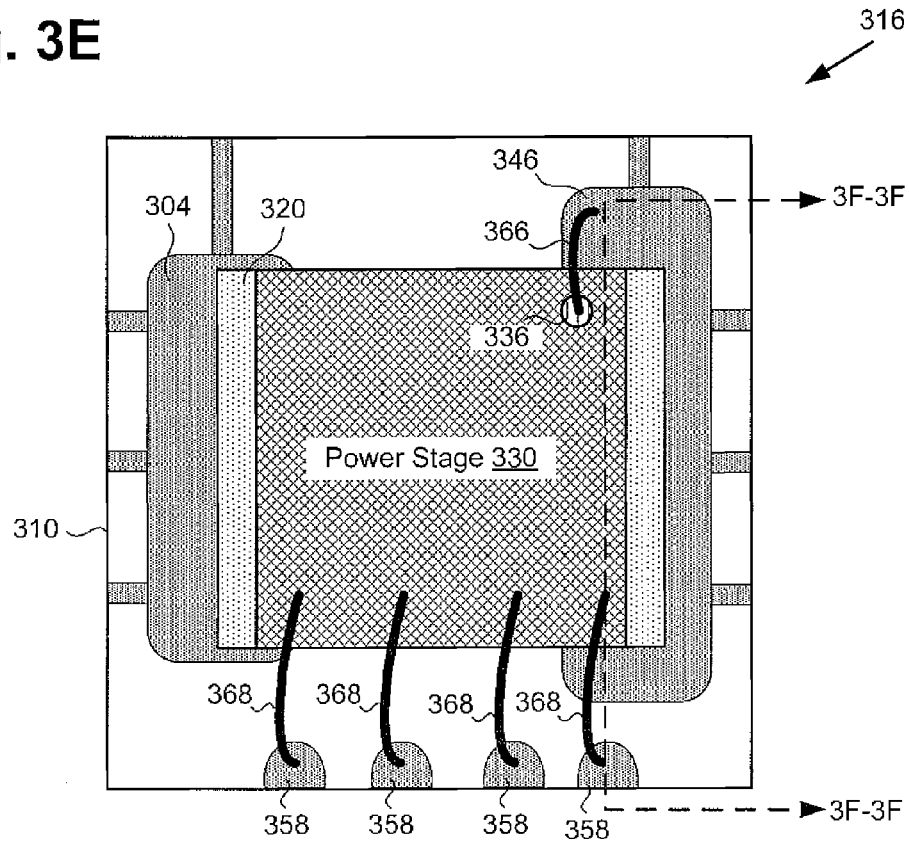
FIG. 3E illustrates a top view of an implementation of the present disclosure, corresponding to an intermediate step in the flowchart in FIG. 2.
Figure 3F:
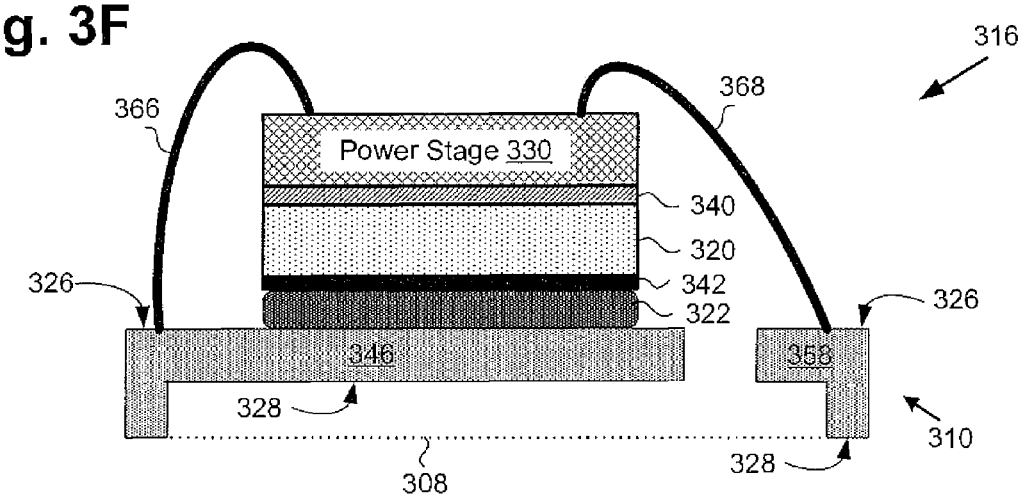
FIG. 3F illustrates a cross-sectional view of an implementation of the present disclosure, corresponding to an intermediate step in the flowchart in FIG. 2.
Figure 3G:
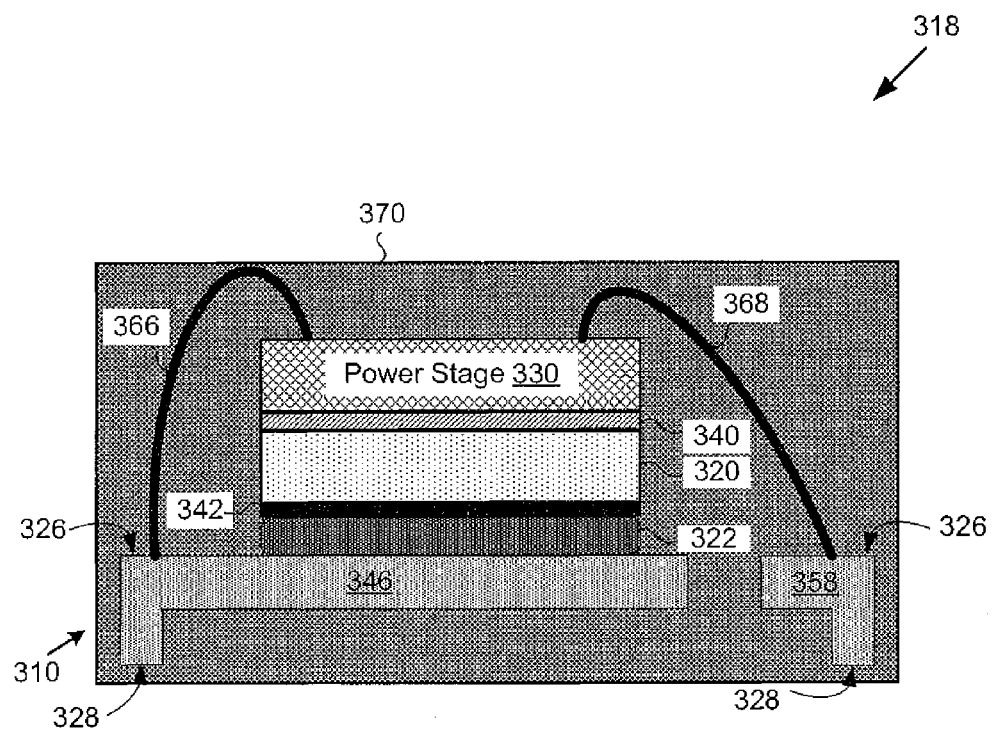
FIG. 3G illustrates a cross-sectional view of an implementation of the present disclosure, corresponding to a final step in the flowchart in FIG. 2.
Figure 3H:
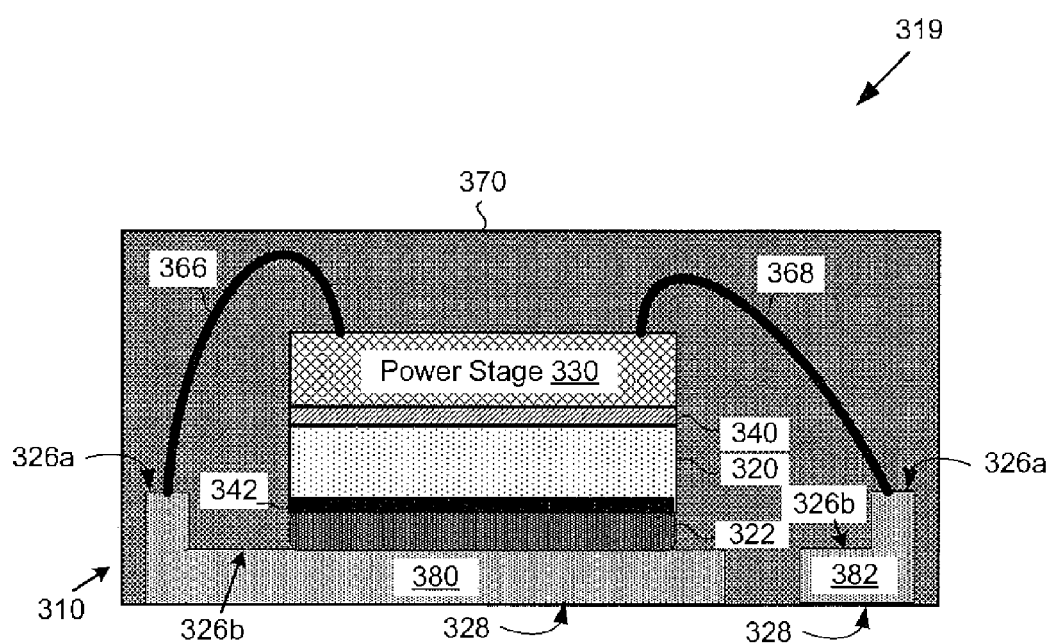
FIG. 3H illustrates a cross-sectional view of another implementation of the present disclosure.

It should be noted with reference to the drawings of the present application that implementations of the present disclosure are described with respect to a power stage and an output inductor within a power semiconductor package, such as power stage 330 and integrated output inductor 320 within power semiconductor package 314 of FIG. 3D, power stage 330 and integrated output inductor 320 within power semiconductor package 316 of FIG. 3E and FIG. 3F, power stage 330 and integrated output inductor 320 within power semiconductor package 318 of FIG. 3G, and power stage 330 and integrated output inductor 320 within power semiconductor package 319 of FIG. 3H. Each power stage 330 may correspond to power stage 130 of FIG. 1 and each integrated output inductor 320 may correspond to output inductor 120 of FIG. 1. In some implementations, a circuit board may include power stage 330 corresponding to power stage 130, integrated output inductor 320 corresponding to output inductor 120, and output capacitor 106 electrically coupled to one another in a manner shown in power converter circuit 100 of FIG. 1.

As electronic devices and systems move toward ever smaller form factors, the large circuit board area still required to accommodate an output inductor, such as output inductor 120 in FIG. 1, becomes increasingly costly. As such, the present application discloses a packaging solution utilizing a stacked architecture enabling fabrication of a power semiconductor package including an integrated output inductor but requiring substantially no greater area than a package enclosing the power transistors and driver circuitry alone. Moreover, in some implementations, use of a conductive carrier having a partially etched, or half-etched component side (also referred to as a recessed component side in the present application) enables fabrication of a power semiconductor package including an integrated output inductor and a power stage having a reduced package height or thickness.

Figure 2:
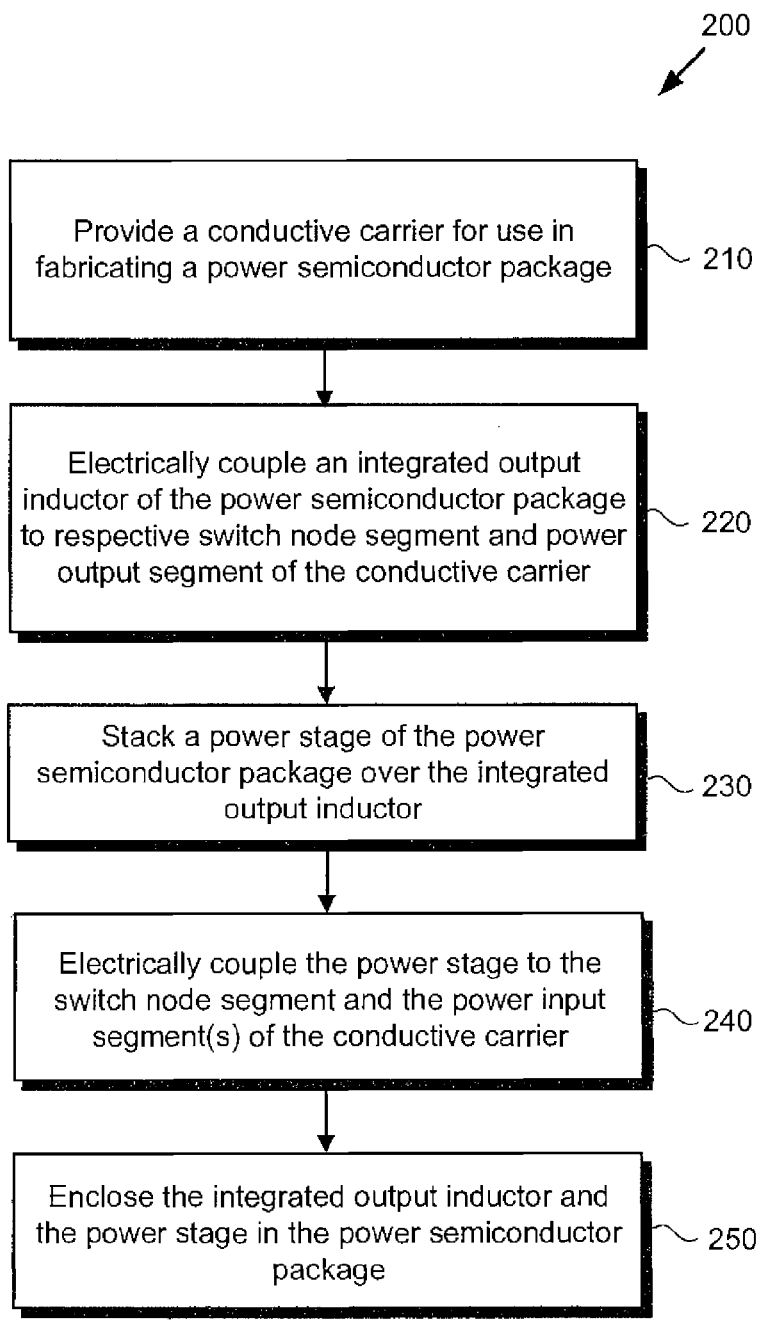
FIG. 2 shows a flowchart illustrating actions taken according to one implementation of the present disclosure.

Referring to FIG. 2, FIG. 2 shows a flowchart illustrating the actions taken according to one implementation of the present disclosure. It is noted that the method described by flowchart 200 is performed on a portion of a conductive carrier structure, which may be a semiconductor package lead frame, or may take the form of a conductive sheet or plate, for example.

With respect to FIGS. 3A, 3B, 3C, 3D, 3E, 3F, and 3G, the structures shown in those figures illustrate the results of performing various actions according to the method of flowchart 200. For example, FIGS. 3A and 3B show respective top and cross-sectional views after performance of action 210 in providing a conductive carrier for use in fabricating a power semiconductor package. FIG. 3C shows a cross sectional view after performance of action 220 in electrically coupling an integrated output inductor of the power semiconductor package to respective switch node and power output segments of the conductive carrier, and so forth.

Flowchart 200 begins at action 210 with providing a conductive carrier for use in fabricating a power semiconductor package. For example, conductive carrier 310 of FIG. 3A and FIG. 3B is provided for use in fabricating power semiconductor package 318. Referring to FIG. 3A, conductive carrier 310 of FIG. 3A includes power output segment 304, power input segment(s) 358, and switch node segment 346.

Referring now to FIG. 3B, FIG. 3B illustrates a cross-section of conductive carrier 310 in the direction of arrows 3B-3B in FIG. 3A. Conductive carrier 310 of FIG. 3B includes power output segment 304 and switch node segment 346. It should be noted that power output segment 304 and switch node segment 346 each include component side 326 and package mounting side 328.

It should further be noted that power output segment 304 and switch node segment 346 are shown as connected by dashed lines 308 to indicate that the gaps between those respective segments may be visible in FIG. 3B due to the cross-sectional perspective viewed in that figure. However, dashed lines 308 do not extend through conductive carrier 310 in a direction perpendicular to the plane of the page of FIG. 3B. Thus, conductive carrier 310 may be provided by a single, substantially continuous, conductive carrier support structure, fully patterned to provide power output segment 304 and switch node segment 346.

Conductive carrier 310 may include any conductive material having a suitably low electrical resistance. For example, conductive carrier 310 may include copper (Cu), aluminum (Al), or a conductive alloy. In one implementation, conductive carrier 310 may be implemented using a single semiconductor package lead frame.

Although not shown in the present figures, in some implementations, conductive carrier 310 may include a barrier metal layer formed on one or both of component side 326 and package mounting side 328. The barrier metal layer may include nickel-gold (NiAu) or nickel-palladium-gold (NiPdAu), for example. In some implementations, the barrier metal layer may serve as an etching mask during patterning of conductive carrier 310.

Referring again to flowchart 200, flowchart 200 continues at action 220 with electrically coupling an integrated output inductor of the power semiconductor package to respective switch node and power output segments of the conductive carrier. For example, power semiconductor package 312 of FIG. 3C includes conductive carrier 310 of FIG. 3A and FIG. 3B after integrated output inductor 320 is coupled to switch node segment 346 and power output segment 304 of conductive carrier 310.

Power semiconductor package 312 of FIG. 3C includes integrated output inductor 320, electrical connectors 322, power output terminal 344, switch node terminal 342, and conductive carrier 310. Conductive carrier 310 includes power output segment 304 and switch node segment 346. It should be noted that integrated output inductor 320 corresponds to output inductor 120, in FIG. 1.

As shown in FIG. 3C, integrated output inductor 320 is stacked over and coupled to component side 326 of conductive carrier 310. More specifically, integrated output inductor 320 is stacked over and configured to couple power output segment 304 to switch node segment 346 of conductive carrier 310. In some implementations, integrated output inductor 320 may have a thickness or height between 0.5 and 2.0 millimeters (mm), a length of 3.0 mm to 4.0 mm, and a depth of 3.0 mm to 4.0 mm, for example. However, the thickness, length, and depth of integrated output inductor 320 may vary depending on the implementation.

In one implementation, integrated output inductor 320 includes a core. The core may include a magnetic core, for example. More specifically, the core may include a high stability ferrite core. In some implementations, the core may have a cylindrical shape, a ring shape, or another suitable shape. The core may include caps, such as circular caps, at each end.

Integrated output inductor 320 further includes a wire winding. The wire winding may include copper, or another suitable conductive material. More specifically, the wire winding may include a high temperature polyurethane copper wire. The number of windings of the wire winding and the diameter of the wire and the core depend on various requirements of integrated output inductor 320 in each implementation. In some implementations, the number of windings of the wire winding may range from 10 to 100 windings. The wire winding includes a first end for coupling to inductor power output terminal 344 and a second end for coupling to inductor switch node terminal 342.

Integrated output inductor 320 further includes inductor power output terminal 344 and inductor switch node terminal 342. Power output terminal 344 is configured to couple the first end of the wire winding of integrated output inductor 320 to power output segment 304. Power output terminal 344 is situated over and electrically coupled to power output segment 304. Switch node terminal 342 is configured to couple the second end of the wire winding of integrated output inductor 320 to switch node segment 346. Switch node terminal 342 is situated over and electrically coupled to switch node segment 346. Each of power output terminal 344 and switch node terminal 342 may include copper, such as a copper alloy, for example. More specifically, each of power output terminal 344 and switch node terminal 342 may include a high condition, heat resistant copper alloy. Integrated output inductor 320 further includes an enclosure. The enclosure may include a molding compound or a plastic case, for example. More specifically, the enclosure may include a low stress epoxy resin.

Integrated output inductor 320 is electrically coupled to switch node segment 346 and power output segment 304 by electrical connectors 322. Electrical connectors 322 may include solder bodies, such as solder balls, for example. In other implementations, electrical connectors 322 may take the form of an electrically conductive die attach material. For example, electrically conductive die attach materials may include conductive epoxies, conductive sintered materials, or diffusion bonded materials.

Referring again to flowchart 200, flowchart 200 continues at action 230 with stacking a power stage of the power semiconductor package over the integrated output inductor. For example, power semiconductor package 314 of FIG. 3D includes power semiconductor package 312 of FIG. 3C after power stage 330 is stacked over integrated output inductor 320 in power semiconductor package 314.

Power semiconductor package 314 of FIG. 3D includes integrated output inductor 320, electrical connectors 322, power output terminal 344, switch node terminal 342, power stage 310, die attach material 340, and conductive carrier 310. Conductive carrier 310 includes power output segment 304 and switch node segment 346. It should be noted that power stage 330 corresponds to power stage 130 of FIG. 1. That is to say, although not explicitly depicted as such in FIG. 3D, power stage 330 includes a driver, a control transistor, a sync transistor, and a switch node, corresponding respectively to driver 132, control transistor 134 ($Q_1$), sync transistor 138 ($Q_2$), and switch node 136 of FIG. 1.

Power stage 330 of power semiconductor package 314 is configured for attachment to integrated output inductor 320. Power stage 330 is stacked over integrated output inductor 320 and coupled to integrated output inductor 320 by die attach material 340. Die attach material 340 may include a non-conductive dielectric material, for example.

Referring again to flowchart 200, flowchart 200 continues at action 240 with electrically coupling the power stage to the switch node segment and the power input segment of the conductive carrier. For example, power semiconductor package 316 of FIG. 3E and FIG. 3F includes power semiconductor package 314 of FIG. 3D after electrically coupling power stage 330 to switch node segment 346 using wire bond 366 and to power input segment(s) 358 using wire bond(s) 368.

Referring to FIG. 3E, power semiconductor package 316 of FIG. 3E includes power stage 330, integrated output inductor 320, wire bond 366, wire bond(s) 368, switch node contact 336, and conductive carrier 310. Conductive carrier 310 includes power output segment 304, switch node segment 346, and power input segment(s) 358. It should be noted that switch node contact 336 of power stage 330 corresponds to switch node 136 of power stage 130, in FIG. 1.

Wire bond 366 is configured to electrically couple power stage 330 to conductive carrier 310. More specifically, wire bond 366 is configured to electrically couple switch node contact 336 of power stage 330 to switch node segment 346 of conductive carrier 310. Wire bond(s) 368 are also configured to electrically couple power stage 330 to conductive carrier 310. More specifically, wire bond(s) 368 are each configured to couple power stage 330 to a respective one of power input segment(s) 358. In some implementations, wire bond 366 and wire bond(s) 368 may each include copper, gold, or another suitable conductive material, for example. However, in other implementations, one or more of wire bond 366 and wire bond(s) 368 may be replaced by conductive ribbons or other connectors including conductive materials such as Al, Au, Cu, and/or other metals or composite materials.

Referring now to FIG. 3F, FIG. 3F shows a cross-sectional view of power semiconductor device 316 in the direction of arrows 3F-3F in FIG. 3E. Power semiconductor package 316 of FIG. 3F includes power stage 330, die attach material 340, integrated output inductor 320, switch node terminal 342, wire bond 368, wire bond 366, electrical connector 322, and conductive carrier 310. Conductive carrier 310 includes switch node segment 346 and power input segment 358. It should be noted that switch node segment 346 and power input segment 358 each include component side 326 and package mounting side 328.

Power semiconductor package 316 of FIG. 3F also includes wire bond 366 electrically coupling power stage 330 to switch node segment 346 of conductive carrier 310. In addition, power semiconductor package 316 includes wire bond 368 electrically coupling power stage 330 to power input segment 358.

Referring again to flowchart 200, flowchart 200 continues at action 250 with enclosing the integrated output inductor and the power stage in the power semiconductor package. For example, power semiconductor package 318 of FIG. 3G includes power semiconductor package 316 of FIG. 3E and FIG. 3F after enclosing integrated output inductor 320 and power stage 330 in packaging enclosure 370.

Referring to FIG. 3G, power semiconductor package 318 of FIG. 3G includes power stage 330, die attach material 340, integrated output inductor 320, switch node terminal 342, electrical connector 322, conductive carrier 310, wire bond 368, wire bond 366, and packaging enclosure 370. Conductive carrier 310 includes power input segment 358 and switch node segment 346. In some implementations, power semiconductor package 318 may be a quad-flat no-leads (QFN) package, such as a power QFN (PQFN) package.

Packaging enclosure 370 is configured to encapsulate power stage 330, die attach material 340, integrated output inductor 320, switch node terminal 342, electrical connector 322, conductive carrier 310, power input segment 358, switch node segment 346, wire bond 368, and wire bond 366 to form an enclosed package. Packaging enclosure 370 may include any suitable substance, such as an encapsulant and/or overmolding compound for providing mechanical and/or environmental protection for power semiconductor package 318.

Referring to FIG. 3H, FIG. 3H illustrates a cross-sectional view of another implementation of the present disclosure. Power semiconductor package 319 of FIG. 3H includes power stage 330, die attach material 340, integrated output inductor 320, switch node terminal 342, electrical connector 322, conductive carrier 310, wire bond 368, wire bond 366, and packaging enclosure 370. Conductive carrier 310 includes flipped power input segment 382 and flipped switch node segment 380. It should be noted that both flipped switch node segment 380 and flipped power input segment 382 include recessed component side 326*b*, raised component side 326*a*, and package mounting side 328. It should further be noted that, although not visible from the perspective shown in FIG. 3H, power output segment 304 may also be flipped to include recessed component side 326*b*, raised component side 326*a*, and package mounting side 328.

In the implementation of FIG. 3H, integrated output inductor 320 and power stage 330 of power semiconductor package 319 may be configured for attachment to and stacked over recessed component side 326*b* of conductive carrier 310. In such an implementation, integrated output inductor and power stage 330 of power semiconductor package 318 may also be configured for attachment and stacked over recessed component side 326*b* of power output segment 304 (not shown in FIG. 3H).

Recessed component side 326*b* of flipped power input segment 382, flipped switch node segment 380, and power output segment 304 may be the result of performing a partial etch during fabrication of conductive carrier 310, for example. In one implementation, for instance, recessed component surface 326*b* may be produced by performing a half-etch of flipped power input segment 382, flipped switch node segment 380, and power output segment 304.

Wire bond 366 of power semiconductor package 319 of FIG. 3H is configured to couple power stage 330 to flipped switch node segment 380. More specifically, wire bond 366 is configured to electrically couple power stage 330 to raised component side 326*a* of flipped switch node segment 380.

Wire bond 368 of power semiconductor package 319 of FIG. 3H is configured to couple power stage 330 to flipped power input segment 382. More specifically, wire bond 368 is configured to electrically couple power stage 330 to raised component side 326*a* of flipped power input segment 382.

Thus, by utilizing a stacked packaging architecture, the present application discloses a compact package design. For example, by stacking power stage 330 over integrated output inductor 320, the packaging solutions disclosed herein enable fabrication of power semiconductor package 318 and/or power semiconductor package 319 with integrated output inductor 320 that requires little or no more circuit board area than a package enclosing power stage 330 alone. Moreover, use of a partial etch on conductive carrier 310 to include a recessed component side further enables power semiconductor package 318 and/or power semiconductor package 319 to have a reduced height.

From the above description it is manifest that various techniques can be used for implementing the concepts described in the present application without departing from the scope of those concepts. Moreover, while the concepts have been described with specific reference to certain implementations, a person of ordinary skill in the art would recognize that changes can be made in form and detail without departing from the scope of those concepts. As such, the described implementations are to be considered in all respects as illustrative and not restrictive. It should also be understood that the present application is not limited to the particular implementations described above, but many rearrangements, modifications, and substitutions are possible without departing from the scope of the present disclosure.

The invention claimed is:

1. A power semiconductor package comprising:
    a conductive carrier including a switch node segment and a power output segment;
    an integrated output inductor stacked over said conductive carrier and configured to couple said switch node segment to said power output segment;
    a power stage stacked over said integrated output inductor.

2. The power semiconductor package of claim 1, wherein said integrated output inductor includes a switch node terminal coupled to a first end of a winding in said integrated output inductor, said switch node terminal situated over and coupled to said switch node segment.

3. The power semiconductor package of claim 1, wherein said integrated output inductor includes a power output terminal coupled to a second end of said winding in said integrated output inductor, said power output terminal situated over and coupled to said power output segment.

4. The power semiconductor package of claim 1, wherein said power stage is coupled to a switch node terminal of said integrated output inductor by a first wire bond connected to said switch node segment.

5. The power semiconductor package of claim 1, wherein said power stage is further coupled to a power input terminal of said power semiconductor package by a second wire bond connected to a power input segment of said conductive carrier.

6. The power semiconductor package of claim 1, wherein said power stage includes at least one group III-V power transistor.

7. The power semiconductor package of claim 1, wherein said power stage includes at least one GaN power transistor.

8. The power semiconductor package of claim 1, wherein said power stage is coupled to said integrated output inductor using a die attach material.

9. A power semiconductor package comprising:
    a conductive carrier including a switch node segment and a power output segment;
    an integrated output inductor stacked over said conductive carrier;
    said integrated output inductor having a switch node terminal coupled to a first end of a winding in said integrated output inductor, said switch node terminal situated over and coupled to said switch node segment;

said integrated output inductor having a power output terminal coupled to a second end of said winding in said integrated output inductor, said power output terminal situated over and coupled to said power output segment;

a power stage stacked over said integrated output inductor.

10. The power semiconductor package of claim 9, wherein said power stage is coupled to a switch node terminal of said integrated output inductor by a first wire bond connected to said switch node segment.

11. The power semiconductor package of claim 9, wherein said power stage is further coupled to a power input terminal of said power semiconductor package by a second wire bond connected to a power input segment of said conductive carrier.

12. The power semiconductor package of claim 9, wherein said power stage includes at least one group III-V power transistor.

13. The power semiconductor package of claim 9, wherein said power stage includes at least one GaN power transistor.

14. The power semiconductor package of claim 9, wherein said power stage is coupled to said integrated output inductor using a die attach material.

15. A power semiconductor package comprising:
a conductive carrier including a switch node segment and a power output segment;
an integrated output inductor stacked over said conductive carrier and configured to couple said switch node segment to said power output segment;
a power stage stacked over said integrated output inductor;
said power stage being coupled to a switch node terminal of said integrated output inductor by a first wire bond connected to said switch node segment;
said power stage being further coupled to a power input terminal of said power semiconductor package by a second wire bond connected to a power input segment of said conductive carrier.

16. The power semiconductor package of claim 15, wherein said integrated output inductor includes a switch node terminal coupled to a first end of a winding in said integrated output inductor, said switch node terminal situated over and coupled to said switch node segment.

17. The power semiconductor package of claim 15, wherein said integrated output inductor includes a power output terminal coupled to a second end of a winding in said integrated output inductor, said power output terminal situated over and coupled to said power output segment.

18. The power semiconductor package of claim 15, wherein said power stage includes at least one group III-V power transistor.

19. The power semiconductor package of claim 15, wherein said power stage includes at least one GaN power transistor.

20. The power semiconductor package of claim 15, wherein said power stage is coupled to said integrated output inductor using a die attach material.

* * * * *